(12) United States Patent
Currie

(10) Patent No.: US 6,651,322 B1
(45) Date of Patent: Nov. 25, 2003

(54) METHOD OF REWORKING A MULTILAYER PRINTED CIRCUIT BOARD ASSEMBLY

(75) Inventor: Thomas P. Currie, St. Paul, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/750,581

(22) Filed: Dec. 28, 2000

(51) Int. Cl.[7] ................................................. H05K 3/34
(52) U.S. Cl. .................... 29/840; 29/402.07; 29/402.09; 29/402.13; 29/843; 29/847; 29/846; 174/260; 174/262; 228/180.5; 228/180.22; 228/199; 439/55; 439/509
(58) Field of Search ................... 29/402.07, 402.09, 29/402.11, 402.13, 830, 831, 840, 843, 846, 847, 852; 228/180.5, 199, 103, 104, 180.22, 248.1; 439/55, 509; 174/260, 262

(56) References Cited

U.S. PATENT DOCUMENTS

| | | | | |
|---|---|---|---|---|
| 3,674,602 A | * | 7/1972 | Keogh | |
| 3,681,841 A | * | 8/1972 | LeBlanc et al. | 29/402.13 |
| 3,701,838 A | * | 10/1972 | Olney | 174/68.5 |
| 3,711,626 A | * | 1/1973 | Kilby | 174/68.5 |
| 4,047,132 A | * | 9/1977 | Krajewski | 333/84 |
| 4,310,811 A | * | 1/1982 | Currie | 333/1 |
| 4,420,877 A | * | 12/1983 | McKenzie | 29/739 |
| 4,588,468 A | * | 5/1986 | McGinty | 156/345 |
| 4,817,436 A | * | 4/1989 | Sallee | 73/708 |
| 4,875,618 A | * | 10/1989 | Hasegawa et al. | 228/180.5 |
| 4,908,938 A | * | 3/1990 | Thorwarth | 29/846 |
| 4,912,843 A | * | 4/1990 | Dederer | 29/846 |
| 4,914,814 A | * | 4/1990 | Behun | 29/843 |
| 4,955,523 A | * | 9/1990 | Calomagno | 228/179 |
| 4,997,122 A | * | 3/1991 | Zimmer | 228/165 |
| 5,045,975 A | * | 9/1991 | Cray | 361/412 |
| 5,180,440 A | * | 1/1993 | Seigel | 136/230 |
| 5,210,939 A | * | 5/1993 | Mallik | 29/840 |
| 5,289,631 A | * | 3/1994 | Koopman | 29/840 |
| 5,290,970 A | * | 3/1994 | Currie | 174/250 |
| 5,384,953 A | * | 1/1995 | Economikos | 29/846 |
| 5,463,191 A | * | 10/1995 | Bell | 174/263 |
| 5,598,965 A | * | 2/1997 | Schen | 228/6.2 |
| 5,608,966 A | * | 3/1997 | Donner | 29/884 |
| 5,695,109 A | * | 12/1997 | Chiang | 228/33 |
| 5,699,612 A | * | 12/1997 | Inoue | 29/843 |
| 5,735,450 A | * | 4/1998 | Heim | 228/191 |
| 5,857,858 A | * | 1/1999 | Gorowitz | 439/86 |
| 5,909,011 A | * | 6/1999 | Chartrand et al. | 174/261 |
| 5,913,687 A | * | 6/1999 | Rathburn | 439/66 |
| 6,009,145 A | * | 12/1999 | Zweig | 378/58 |
| 6,015,955 A | * | 1/2000 | Farooq | 174/260 |
| 6,031,729 A | * | 2/2000 | Berkely | 361/771 |
| 6,034,875 A | * | 3/2000 | Heim et al. | 361/719 |
| 6,084,174 A | * | 7/2000 | Hedengren | 136/201 |
| 6,115,912 A | | 9/2000 | Crudo et al. | 29/840 |
| 6,172,879 B1 | * | 1/2001 | Cilia et al. | 361/778 |
| 6,208,156 B1 | * | 3/2001 | Hembree | 324/755 |
| 6,293,455 B1 | * | 9/2001 | Caletka et al. | 228/103 |
| 6,326,797 B2 | * | 12/2001 | Caggiano et al. | 324/719 |

* cited by examiner

*Primary Examiner*—Peter Vo
*Assistant Examiner*—Paul D Kim
(74) *Attorney, Agent, or Firm*—Charles A. Johnson; Mark T. Starr

(57) ABSTRACT

An improved rework method and rework wiring structure for repairing and reworking multilayer printed circuit boards utilizing ball grid array (BGA) solder pads are described. The repair method includes the steps of locating a solder pad to be rewired, removing the identified pad, installing a repair wire through a via hole in a multilayer printed circuit board, and forming a replacement solder pad on the end of the repair wire and positioning it in place of the removed pad. Once thus installed, the method includes the step of connecting the other end of the repair wire to a corrected circuit interconnection point.

14 Claims, 5 Drawing Sheets

METHOD OF REWORKING A MULTILAYER PRINTED CIRCUIT BOARD ASSEMBLY

CROSS REFERENCE TO CO-PENDING APPLICATIONS

This application is related to commonly assigned and co-pending U.S. Patent Application. This application is related to commonly assigned and co-pending U.S. Pat. application Ser. No. 09/750,582, filed Dec. 28, 2000, and issued as U.S. Pat. No. 6,443,739 on Sep. 3, 2002, and entitled "LGA Compression Contact Repair System".

BACKGROUND OF THE INVENTION

1. Field of the Invention

The invention relates to an improved method and apparatus for repairing or reworking complex multilayer printed circuit board interconnections; and more particularly to a system of repairing circuit net connections using ball grid array contacts.

2. Description of the Prior Art

It is known to utilize printed circuit boards to make electrical interconnections between leads of electrical components mounted thereon, including mounted integrated circuits. Printed circuit boards characteristically involve one or more discrete layers of insulating material upon which patterns of electrical conductors are formed in conjunction with a predetermined array of holes. The electrical conductors are referred to as foil. The layers are stacked, bonded, and the hole patterns formed and plated-through with electrical conductive materials. Characteristically, plated-through holes are uniform in diameter, and are often referred to as "barrels". Selective interconnections result in selected wiring networks, or nets, being formed with various ones of the electrical conductors on different layers being interconnected through plated-through holes. This effectively provides a three-dimensional wiring system. At the mounting surfaces, it is known to provide additional electrically conductive material in electrical contact with the plated-through holes for the purposes of providing an expanded pad area for making interconnection with the component contacts, terminals, leads, or mounting contacts.

It has been the usual practice to have the diameter of the plated-through holes uniform throughout the thickness of the multilayer printed circuit board. With the advent of continued reduction in size of the electronic components, the spacing of the component connections has been decreasing, and the density of the associated array of holes has been ever-increasing. As the density of integrated circuit components increase the array of interconnection points to a printed circuit board multiplies for the same integrated circuit die size. At the same time, the complexity of the interconnections that are to be made by the multilayer printed circuit boards has increased. This increase in the number of interconnections results in the requirement of providing more conductive routing paths on the various layers, where these routing paths must be constructed in ever-decreasing dimensions. The loss of routing area resulting from the reduction in pin spacing in the grid array of plated-through holes has lead to the requirement of adding additional layers to the multilayer printed circuit board assemblies, with the attendant increase in cost of manufacture.

It is known to utilize so-called surface mount components, where relatively short component leads are affixed to surface pads on the multilayer printed circuit boards. Characteristically, they are affixed through a solder process. The surface mount has the problem of location of all of the terminals of a component over the associated interconnection pads during the soldering process. Any misalignment or misplacement can result in missing or marginal solder interconnections.

A form of surface mount includes the process of mounting packaged integrated circuits (IC) to printed circuit board assemblies having an array of pads on the printed circuit board interconnected to a matching array of IC contacts through a soldering process that uses solder balls. This interconnected technology is generally referred to as a ball grid array (BGA).

It is also well-known in the design of the electrical interconnections to be made on the printed circuit board assembly, that design problems can result in wiring network layouts that must be altered or reworked to form correct wiring network interconnections. Further, it is known that in the fabrication of multilayer printed circuit boards it can occur, for various manufacturing reasons, that one or more layers may have electrical conductors improperly electrically shorted to a plated-through hole. Unless such re-routing or shorted condition can be repaired, the entire assembly has to be scrapped. Various types of rework and repair techniques have been developed, but such known repair and rework techniques are complex; and if not accomplished with skill and precision, can result in further damage to the printed circuit board and failure to remedy the problem. As the array of printed circuit board interconnections become larger there is an increase in the number of plated-through holes of smaller diameter, and more layers, are utilized, it becomes more and more necessary to have an effective and efficient way to rework incorrect or defect wiring nets to save the boards.

The development of integrated circuits (ICs), including application specific integrated circuits (ASICs), requires on-circuit interconnection of cells and requires off-circuit interconnections to connect circuits on different ICs or to connect to connectors or other components, power, ground, and the like. When design errors, manufacturing errors, or design changes occur relative to interconnection of IC pins, the entire supporting printed circuit board must be scrapped unless a repair system is provided.

For those systems where ICs or ASICs were interconnected through metal pins soldered into plated-through holes in the printed circuit boards or to pads on the surface of the printed circuit boards it was possible to solder the repair wire directly to the pin or surface pad. Those resoldering processes usually required the pin to be disconnected from the wiring net within the printed circuit board to be accomplished by drilling out the via hole in the printed circuit board to disconnect the internal wires. It has been determined, however, that structures that utilize BGA surface contact solder connection to interconnect the ICs or the ASICs to the printed circuit board that such a drilling out and resoldering process cannot be accomplished within the tolerances of the structure. Further, the drilling out process requires very close tolerance and often results in destruction of the solder pad.

Accordingly, it is desirable to have a repair system and method that overcomes the limitations for repair incident in the prior art.

OBJECTS

It is the primary objective of this invention to provide a method and apparatus to efficiently repair and rework multilayer printed circuit boards.

It is a further primary objective of this invention to provide an improved printed circuit board assembly having an improved structure for use in affixing electrical components that may be reworked as necessary to correct design and manufacturing deficiencies.

Yet another objective of the invention is to provide an improved printed circuit board assembly having a structure for affixing electrical components that is suitable for use with BGA interconnections.

Another objective of the invention is to provide an improved multilayer printed circuit board assembly having an array of plated-through holes to interconnect selected layers, and a rework structure that can be utilized to rework circuit interconnections with selected ones of the plated-through holes.

A further objective of the invention is to provide an improved multilayer printed circuit board assembly for use with an enhanced capability of rework or repair to allow repair of defects in manufacture and rework of erroneous interconnections of electrical wiring networks with improved rework structures.

Still a further objective of the invention is to provide an improved repair and rework pad structure for use with a multilayer printed circuit board assembly for effectively and reliably allowing the repair and rework of the assembly to accommodate solder interconnections with integrated circuits.

Yet another objective of the invention is to provide an improved reworked pad structure that matches the shape of a removed pad, has an insulating material deposited on a portion thereof, and a conductive portion that interacts with a BGA solder pad.

A further objective of the invention is to provide an improved rework apparatus and method to efficiently and economically rework multilayered printed circuit boards to avoid the necessity to scrap defective or damaged boards.

Other more detailed objectives will become apparent from a consideration of the Drawings and the Detailed Description of the Preferred Embodiment.

SUMMARY OF THE INVENTION

To overcome the problems in the prior art and improved repair and rework method have been developed wherein the repair and rework method is applied to rework a circuit connection on a multilayer printed circuit board that mounts one or more integrated circuits and have a predetermined array of BGA solder pads to interconnect with each integrated circuit, wherein the array of pads are electrically connected to respectively associated via lands on plated-through hole barrels on a first surface of a printed circuit board, where each of the barrels extends through the printed circuit board to a second surface. The barrels are formed as plated-through holes and interconnect to predetermined wiring nets within the printed circuit board. The repair method involves disassembling the integrated circuit from the ball grid array of solder pads to which the integrated circuit is electrically connected, to thereby expose the array of solder pads. A particular pad is identified to be repaired, and the identified pad is removed along with its associated via pad and interconnecting foil. A repair wire is selected and placed in the associated barrel of the plated-through hole from which the identified solder pad has been removed, with the insertion being such that a first end is extended past the first surface of the printed circuit board and is available for forming. Once installed, the exposed end of the repair wire is formed into a shape to approximate that of the removed solder pad. The formed pad is positioned and bonded to the first surface of the printed circuit board. The second end of the repair wire is routed and connected to the appropriate corrected circuit connection to complete the rework and repair. The entire assembly is then reassembled with the removed integrated circuit brought into electrical interconnection with the array of solder pads, including the newly formed pad formed on the repair wire.

For certain repair functions it, is desirable to provide a selective coating on the newly formed solder pad on the end of the repair wire. By way of example, it may be necessary to coat the replacement repair contact pad with gold to match the performance of the other pads in the ball grid array and to treat the repair pad with solder so that it will properly make soldered connection when subjected to the solder ball soldering process.

An improved repaired assembly has been provided and includes a multilayer printed circuit board having first and second surfaces; an array of BGA solder pads arranged on said first surface to electrically interconnect associated contacts on at least one integrated circuit mounted on the multilayer printed circuit board; a plurality of electrical wiring nets in the multilayer printed circuit board; a plurality of plated-through holes extending through the printed circuit board between the first and second surfaces, with selected ones of the plurality of plated-through through holes in a electrical contact with associated ones of the plurality of wiring nets, and each of the plurality of plated-holes electrically connected to an associated different one of the array of the BGA solder pads; a repair wire having a first end portion formed in the shape of a solder pad and positioned on the first surface of the printed circuit board to replace a removed one of the array of solder pads, and the repair wire having a board transition portion extending through the one of the plated-through through holes that is associated with the removed one of the pads, and the repair wire having a second end portion extending beyond the second surface and making circuit connection to a selected circuit interconnection point to repair the function of the circuit.

DETAILED DESCRIPTION OF THE PREFERRED EMBODIMENT

Figure 1:
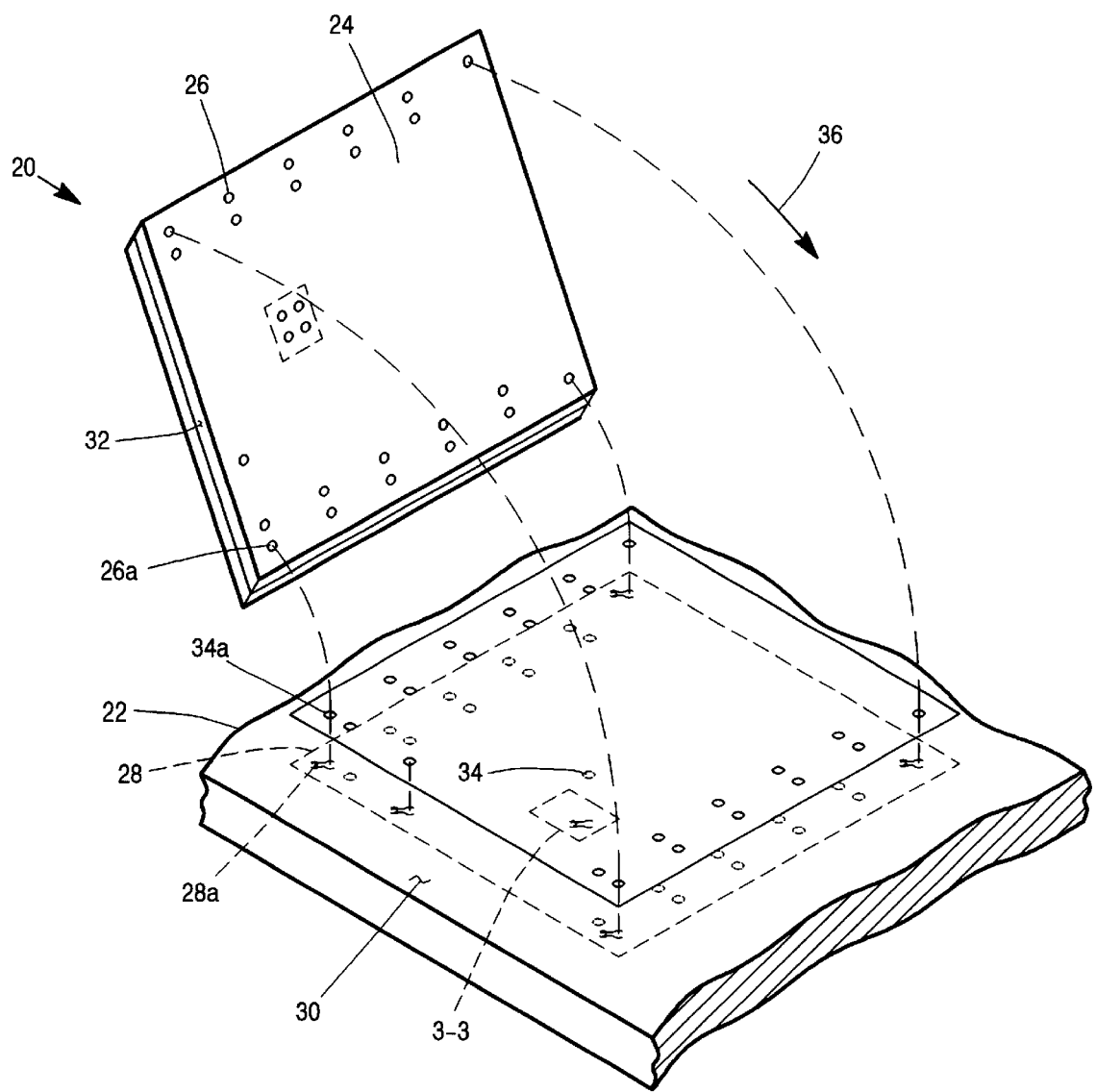
FIG. 1 is an exploded view of an integrated circuit package that utilizes a ball grid array (BGA) system of solder contacts to interconnect the integrated circuit to an array of solder pads on a printed circuit board.

FIG. 1 is an exploded view of an integrated circuit package that utilizes a ball grid array (BGA) system of solder contacts to interconnect the integrated circuit to an array of solder pads on a printed circuit board. In this configuration of a packaged integrated circuit 20 is shown separated from printed circuit board 22. The underside 24 of the packaged integrated circuit 20 has an array of contacts 26 that cooperates with the array of contacts 28 on the upper surface 30 of printed circuit board 22. The carrier 32 is characteristically ceramic and has the array of contacts 26 to be bonded to the integrated circuit contacts (not shown) this array of contacts 26 cooperate with an array of solder balls 34, which in turn cooperate with the array of contacts 28 when the packaged integrated circuit is positioned in the direction of arrow 36. Printed circuit board 22, shown broken away, has at least one array of interconnection pads, one of such arrays being shown within dashed block 28. This array of solder pads 28 is adapted to mate with the array of solder balls 34 and the array of contacts 26 on the underside 24 of packaged IC 20. Printed circuit board 22 has a number of layers supporting a number of interconnecting foils (not shown) for purposes of making interconnection to other components or integrated circuits (not shown). An array of the plated-through holes (not shown) in printed circuit board 22 are provided.

When positioned, contact 26a will be in contact with solder ball 34a, which in turn will be in contact with solder pad 28a. All other contacts 26 will be positioned over associated solder balls 34 and will be in contact with associated ones of solder pads 28. When thus positioned, the soldering process is accomplished.

Interconnection between integrated circuits on this type of assembly is characteristically through the various printed circuit board foil paths (not shown) that are part of the multilayer printed circuit board 22. When a design is laid out interconnecting specific contacts between different integrated circuits in a larger assembly or in making connection to connectors, it can be determined that wiring errors have occurred. When such a condition is encountered, if the wiring interconnection between integrated circuits or other components cannot be corrected, the entire printed circuit board assembly 22 must be discarded. It is toward remedying this condition that the present invention is directed.

Figure 2:
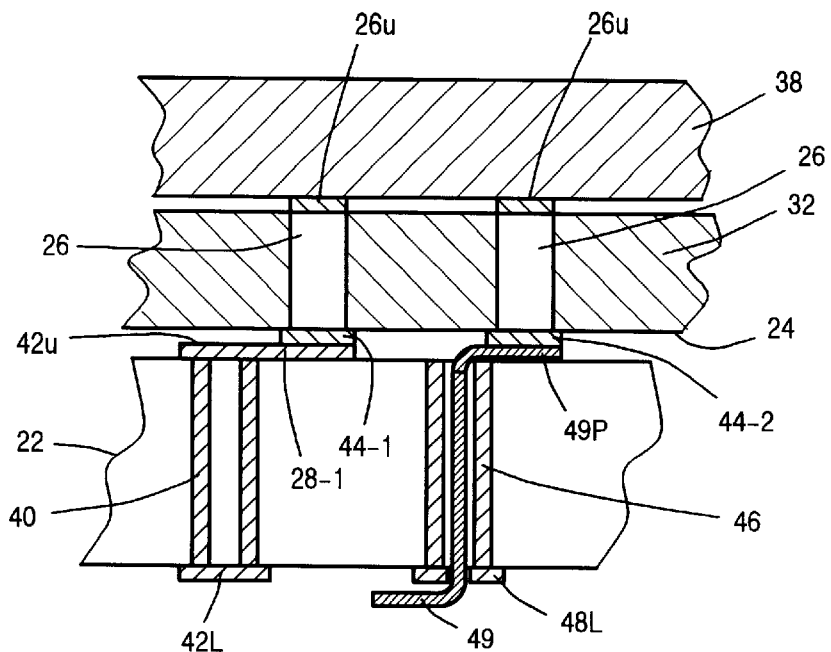
FIG. 2 is a partial cross-section view of a portion of the printed circuit board with a BGA solder interconnection to a plated-through hole and to a repair structure.

FIG. 2 is a partial cross-section view at 2—2 of a portion of the printed circuit board with a BGA solder interconnection to a plated-through hole and to a repair structure. This view shows carrier 32 with pads 26 in contact at their up ends 26U to integrated circuit 38. Printed circuit board assembly (PCBA) 22 has plated-through hole 40 with an upper via land 42U and lower via land 42L. Solder pad 28-1 is soldered 44-1 to its associated contact end 26. Plated-through hole 46 has a lower via land 48L but has had its upper via land removed. Repair 49 extends through the barrel of plated-through hole 46 and has its replaced solder pad end 49P soldered 44-2 to its associated contact 26.

Figure 3:
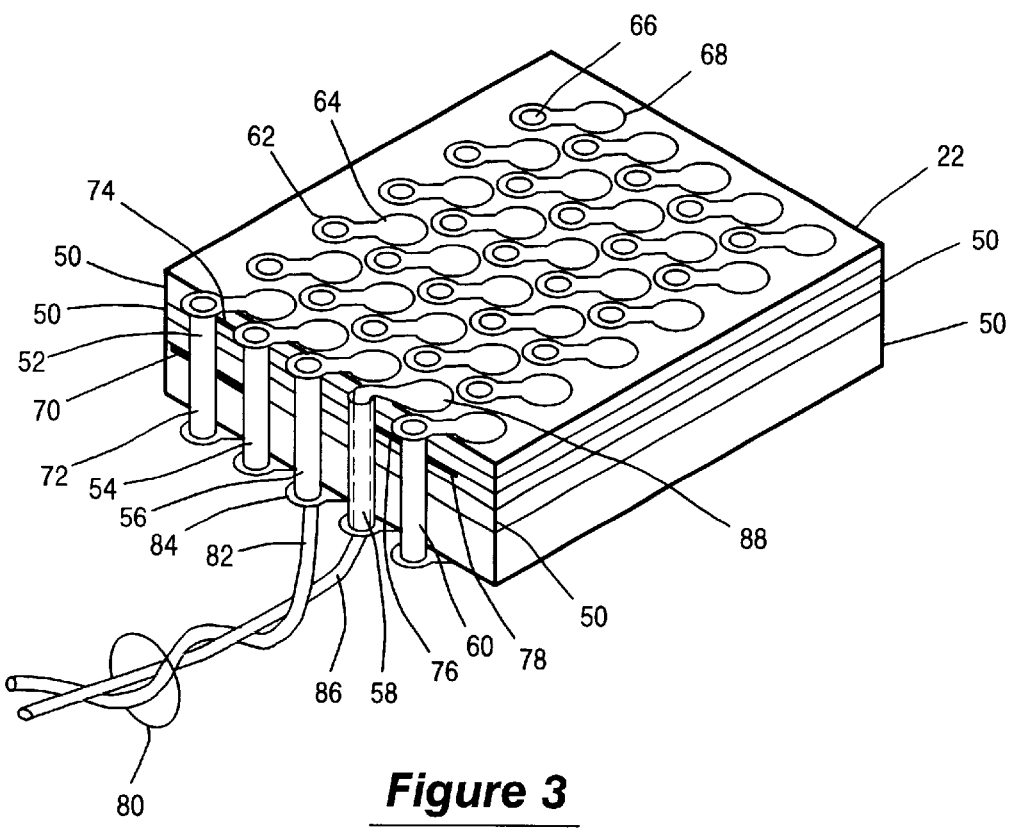
FIG. 3 is a cutaway view at 3—3 in FIG. 1 of a portion of a multilayer printed circuit board having an array of BGA pads and illustrating the repair structure of this invention.

FIG. 3 is a cutaway view at 3—3 in FIG. 1 of a portion of a multilayer printed circuit board having an array of BGA pads and illustrating the repair structure of this invention. Printed circuit board 22 is comprised of a number of insulating layers 50 upon which interconnecting foil is deposited in a predetermined pattern to make interconnection with various ones of the plated-through holes. Plated-through holes are comprised of conductive barrels such as barrels 52, 54, 56, 58, and 60. In addition, each plated-through hole has an upper associated via land 62 that is electrically connected to a solder pad 64. Further, each of the plated-through holes has an open barrel 66 that extends vertically through the thickness of the printed circuit board 22.

In a characteristic array utilizing a BGA solder system to interconnect to mounted integrated circuits, the array of solder pads and plated-through holes can require 1,657 or more connections on one millimeter centers, or less and can require a thickness 68 of a contact pad to be flat within a tolerance of 0.002 inch.

Interconnection between various ones of the plated-through holes are illustrated by connectors 70, 72, and 74 being connected to barrel 42; conductors 72 and 74 being connected to plated-through barrel 54; conductor 76 being connected between barrels 58 and 60; and conductor 78 being connected to plated-through barrel 60. These interconnections are of course by way of illustration only and are merely shown to indicate that the electrical interconnections to the plated-through-hole barrels will not be interrupted or changed as a result of the repair process of the invention.

A repaired pad is shown utilizing a twisted pair 80 that has one wire 82 connected at the lower via pad 84 of barrel 56. The signal wire 86 is passed upward through the opening 66 of barrel 58. The exposed end is shaped to form a solder pad 88 that is positioned to replace the removed pad 64 from the position to be corrected. Once positioned and adhered to the surface of printed circuit board 22, the twisted pair 80 can be routed to make the circuit connection correction required.

Figure 4A:
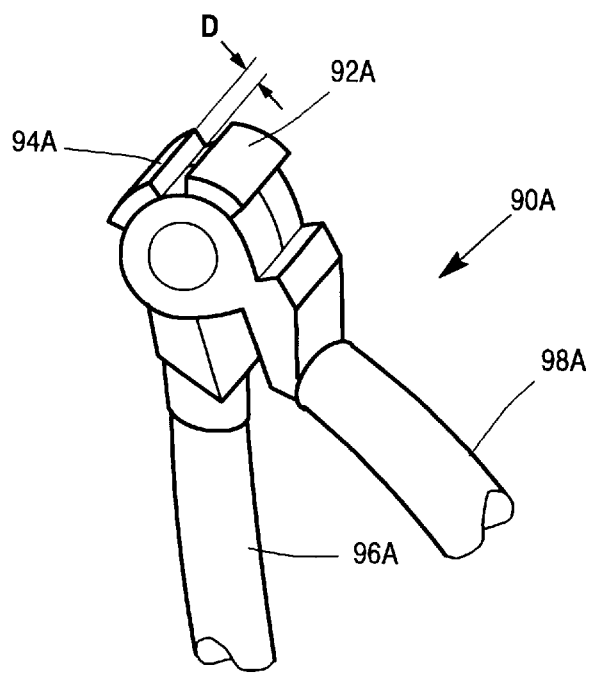
FIG. 4A is a pictorial view of a tool that can form the replacement pad shape on a repair wire.

FIG. 4A is a pictorial view of a tool that can be utilized to form the replacement pad shape on a repair wire. This tool 90A has a pair of jaw members 92A and 92B, each having flat compression surfaces of a predetermined depth D that can be utilized to establish the length of the portion of the repair wire that is to be reshaped in the form of a replacement solder pad. Handle portions 94A and 96A are shown broken away, and are utilized to apply sufficient pressure to jaw members 92A and 9A to flatten the end of a repair wire to the desired thickness.

Figure 4B:
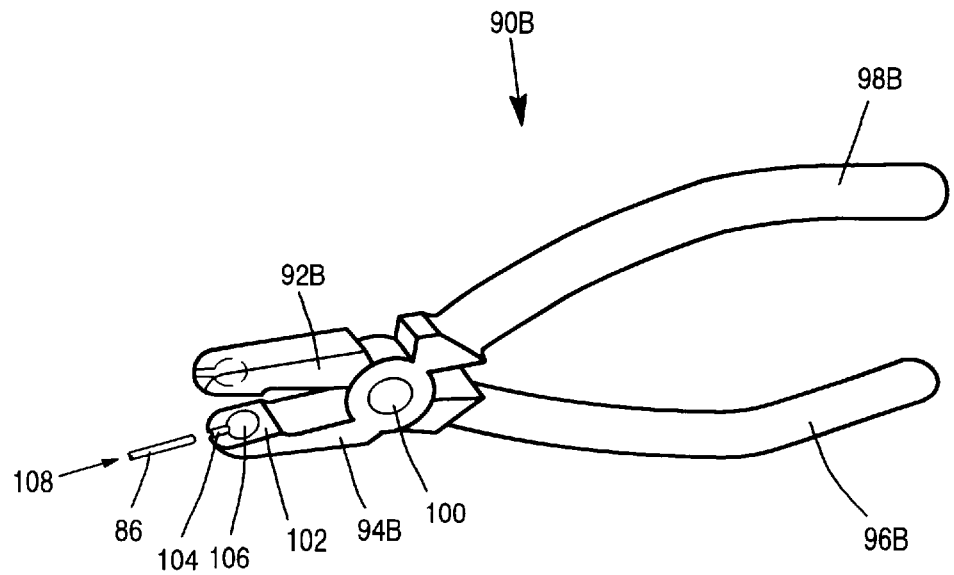
FIG. 4B is a pictorial view of an alternative tool that can form the replacement pad shape on a repair wire.

FIG. 4B is a pictorial view of an alternative tool that can form the replacement pad shape on a repair wire. Tool 90B has a pair of opposed jaw members 92B and 94B activated by associated handles 96B and 98B, which are rotatably coupled together by pin 100. Member 94B has a flattened portion 102 in which a wire receiving groove 104 is in communication with a shaping cavity 106. A mating structure is shown in member 92B in dashed line. In operation, the stripped tip of wire 86 is positioned and inserted in the direction of arrow 108 into the receiving aperture 104. When the tip of wire 86 is fully positioned into the shaping portion 106, the tool 90B is closed with sufficient force to flatten the tip of wire 86 into the conforming shape 106.

Figure 5:
FIG. 5 illustrates a repair wire with a shaped replacement pad.

FIG. 5 illustrates a repair wire with a shaped replacement pad. Once the tip of wire 86 has been formed into shaped portion 88 through the use of a tool 90A or 90B, it has a shape that approximates the solder pad portion 64.

Figure 6:
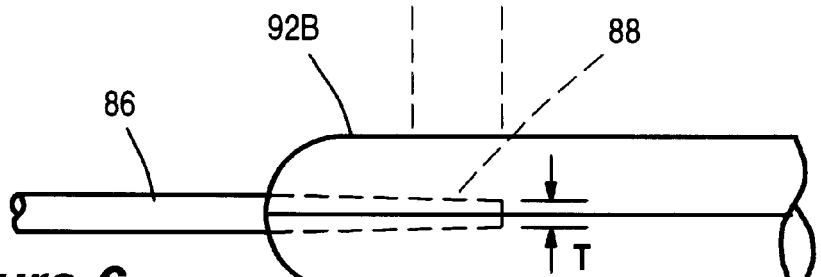
FIG. 6 illustrates a pad-shaping portion of the tool shown in FIG. 4B.

FIG. 6 illustrates a pad-shaping portion of the tool shown in FIG. 4B. This broken away view illustrates opposed jaw members 92B and 94B in a closed position around the end 88 of wire 86 and illustrates the thinning of the thickness T of portion 88 to a dimension approximating 0.002 inch.

Figure 7:
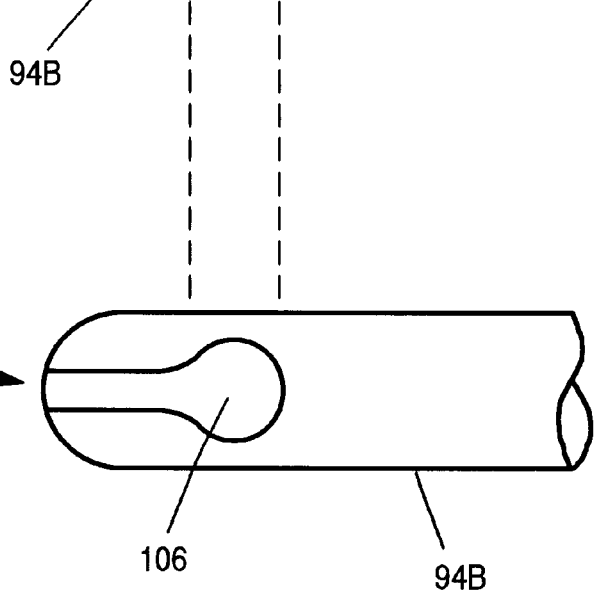
FIG. 7 illustrates the face view of one of the pad shaping elements described in FIG. 6.

FIG. 7 illustrates the face view of one of the pad shaping elements described in FIG. 6. In this view the face of member 94B is illustrated having the wire receiving portion 104 and the shaping cavity 106. Cavity 106 approximates the shape of element 88 shown in FIG. 5. It is of course understood that once wire 86 is passed through the appropriate plated-through through barrel opening 66 and in 88 is suitably formed, the replacement solder pad 88 must be bent at right angles to the tip of wire 86 in order to be put into conformance with the upper surface of printed circuit bard 22.

Figure 8:
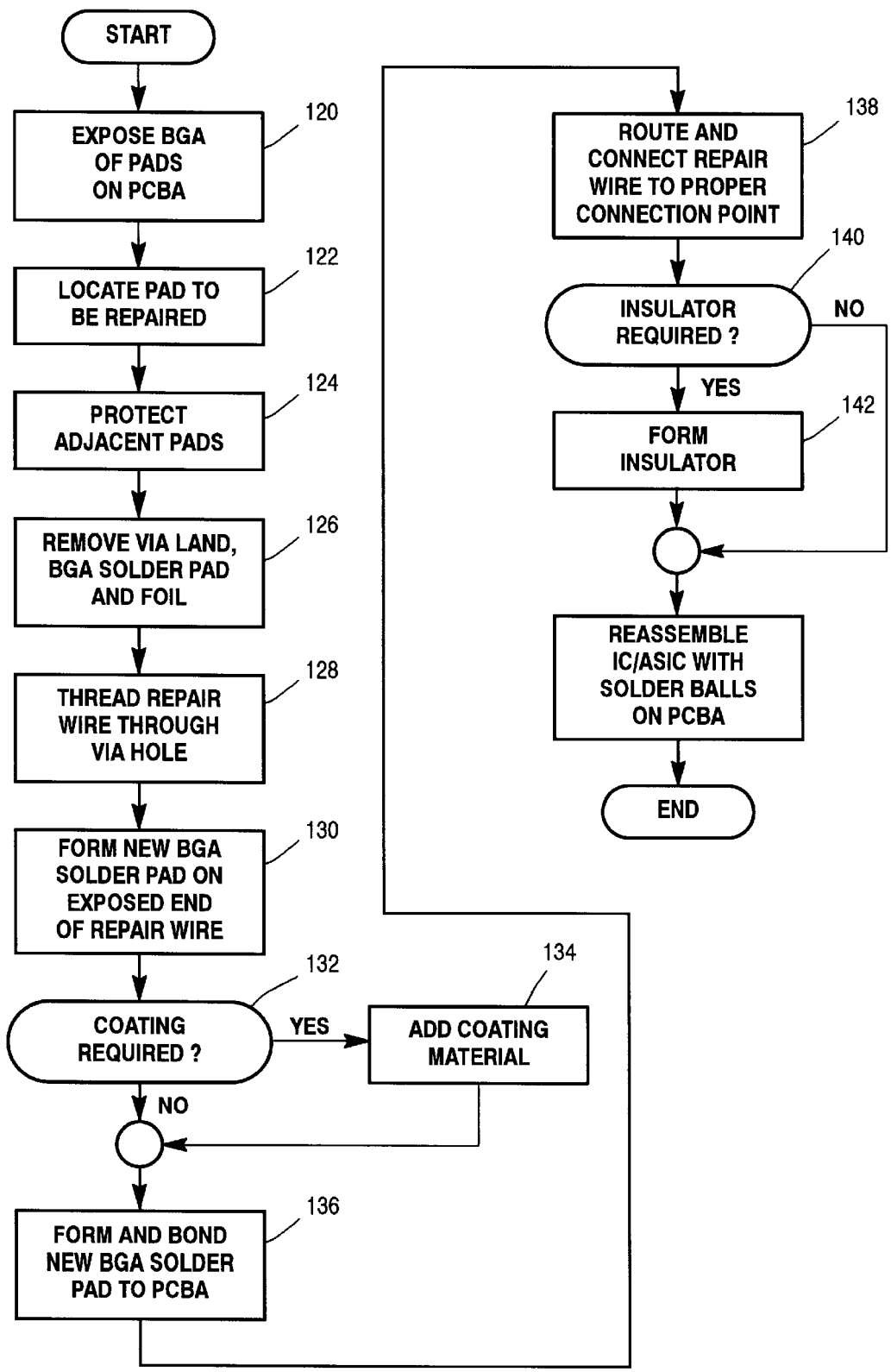
FIG. 8 is a process flow diagram illustrating the repair and rework process.

FIG. 8 is a process flow diagram illustrating the repair and rework process.

Once it has been determined that an error condition exists that requires wiring net correction, it is necessary to identify the IC or ASIC involved, and for the appropriate component, remove the selected packaged IC 20. This is necessary to expose the BGA solder pads 28 on the multilayer printed circuit board (PCBA) 22, as indicated by method step 120. Once exposed, the particular pad that is identified to be rewired is located and a marker wire inserted in the barrel, as indicated by the method step 122 to locate the pad to be repaired. Once a pad is identified, the method step of protecting adjacent pads 124 is accomplished by taping over or other suitable protective measures. To initiate the repair, it is necessary to remove the via land, the BGA solder pad and the interconnecting foil, as indicated by step 126. A via land is alternatively referenced as a via pad. With reference to FIG. 3, one method of removing the via pad 62 is to utilize a drill bit having a diameter of about 0.020 inch to drill into the via pad thereby removing it. This drilling must be controlled as to the depth of drill to avoid impacting or disconnecting any of the foil interconnections on the internal planes of printed circuit board 22. Once via pad 62 is removed, the associated solder pad and any remaining interconnecting conductive material is removed by heating it with a heating iron to temperature that softens the bonding material and allows it to be raised and removed by a blade. A replacement repair wire can be of the twisted pair 80 described with regard to FIG. 3, or can be a single wire as described in FIG. 2, utilized to make circuit interconnections. In the preferred embodiment for the type of printed circuit board 22 described, the twisted pair wire can be selected as a 34 gauge wire pair. The single wire can be a 34 gauge magnet wire, it being understood that the twisted pair wire and alternatively the magnet wire have electrical insulation on their respective surfaces at least on the portion positioned within the plated-through hole. Once a repair wire is selected, it is necessary to remove the marker wire and to thread the repair wire through the via hole as indicated by step 128. A sufficient length of wire is threaded through the via hole such that it protrudes on both sides of printed circuit board 22. With either the twisted pair or magnet wire selection, it is necessary to have sufficient wire on the underside of the printed circuit board to route to the appropriate connection points. The amount of wire extending above the surface of printed circuit board 22 need be only enough to be gripped by the pad forming tool (see FIG. 4A and FIG. 4B). It is then necessary to form a new solder pad on the exposed end of the repair wire 130 by physically deforming the end of the repair wire to form the replacement pad. Once formed, the replacement pad is bent at right angles to the barrel of the plated-through hole and is available for attachment.

If the printed circuit board to be repaired is for development purposes, the formed solder pad can be the material of the replacement wire. In those situations where it is desired that the repaired printed circuit board have characteristics similar to the array of pads not repaired, it may be necessary to coat the replacement contact pad with an appropriate material. Accordingly, it is necessary to determine whether a special coating material is required, as indicated by step 132, and if it is required, to add the special coating material per method step 134 to the replacement solder pad. By way of example, if the solder pads in the array are all gold plated, it may be desirable to use gold plated wire or to gold coat the replacement pad to enhance solderability. It is also desirable to treat the replacement solder pad for the BGA soldering process. When the replacement pad 88 is formed and ready for attachment, it is essentially at right angles to the associated barrel comprising the plated-through hole. The formed pad 88 is positioned and bonded to the surface of printed circuit board 22 as indicated by method step 136. Bonding in a preferred embodiment is accomplished by carefully applying a selected adhesive, which by way of example can be Loctite Takpak adhesive system. Other adhesives may be available or preferred by those skilled in the art.

Once the replacement solder pad has been formed and adhered to the printed circuit board, it is necessary per method step 138 to route and connect the repair wire the proper connection point. Depending upon whether a twisted pair magnet wire replacement is utilized, this routing and connection process will differ. When a twisted pair is utilized, as illustrated in FIG. 3, the non-signal wire 82 is characteristically electrically connected to a ground via pad. This interconnection is accomplished my exposing the tip of ground wire 82 and soldering it to via pad 84. The twisted pair is then routed to the selected connection locations and electrically interconnected as needed. In the event the magnet wire is utilized for making interconnection to another location within the same array of solder pads or is made to a solder contact connection on a different array, sufficient magnet wire must have been provided to allow routing and to allow the extension of the other end through another selected plated-through hole barrel for formation of replacement solder pad at the other end of the wire. That interconnection would require a similar repeat of steps 122 through 136.

Once the repair wire or wires have been put in place, it is necessary per method step 140 to determine whether or not a special insulator will be required. A special insulator may be required to prevent the rework wires from being pinched. The insulator material is positioned over the underside of the printed circuit board 22 with the repair wire or wires visible. A pattern is formed of the path of the repair wire or wires, and that pattern is cut in the special insulator. The paths thus cut allow the repair wire or wires to be disposed in the cut out area while allowing the insulator material to lie flush with the underside of the printed circuit board, all without pinching or deforming the repair wire or wires.

From the foregoing it can be seen at the various objectives and purposes of the invention have been achieved. The use of the replaced solder pads and the associated correction wires results in an improved rework method and an improved reworked multilayer printed circuit board structure. The rework process and apparatus is extremely cost-effective in that the reworked solder pads and wire interconnections can save time in the repair of development units and can save expensive board structures from being scrapped.

The invention has been described in its presently contemplated best mode, and it is clear that it is susceptible to various modifications, modes of operation and embodiments, all within ability and skill of those skilled in the art without the exercise of further inventive activity. Accordingly, what is intended to be protected by Letters Patent is set forth in the appended claims.

What is claimed is:

1. A method of reworking a multilayer printed circuit board having a predetermined array of solder pads electrically connected to respectively associated via lands on plated-through barrels on a first surface of the printed circuit board, each of the barrels extending through the printed circuit board to a second surface and interconnecting to predetermined wiring nets within the printed circuit board and each of the barrels further having an opening, said method comprising the steps of:

a. identifying one of the solder pads requiring a changed electrical connection;

b. removing the identified solder pad from the first surface without interrupting the wiring net associated therewith;

c. selecting a repair wire;

d. inserting a first end of the selected repair wire in the barrel opening associated with the identified and removed solder pad until a predetermined portion of the first end is exposed beyond the first surface;

e. after insertion of the selected repair wire, shaping the end of the predetermined portion in a shaped end substantially in the shape and thickness of the identified and removed solder pad;

f. positioning the shaped end on the first surface in a position to replace the removed identified solder pad; and g. affixing the positioned shaped end to the first surface.

2. The method of claim 1, wherein said selecting step c includes the further method step of:

h. selecting a single wire having a sufficient length to make electrical connection to a predetermined electrical circuit.

3. The method of claim 1, wherein said selecting step c further includes the method steps of:

h. selecting a twisted pair wire having a sufficient length to make electrical connection to a predetermined electrical circuit, including a signal wire and a ground wire; and i. connecting the ground wire to a predetermined ground terminal on the printed circuit board.

4. The method as in claim 1, and further including the step of:

h. coating the shaped end of the repair wire with a predetermined material.

5. The method as in claim 4, and further including the step of:

i. selecting gold as said predetermined material.

6. The method as in claim 1, on further including step of:

h. treating the shaped end for a solder process.

7. The method as in claim 1, wherein the removing step b includes the methods steps of:

h. drilling the via land to a predetermined depth to remove the via land without damage to any wiring net in the printed circuit board;

i. heating the identified solder pad sufficiently to soften the interconnection to the first surface of the printed circuit board; and j. lifting the selected solder pad off the first surface.

8. The method as in claim 1, wherein the shaping step e includes the steps of:

h. subjecting the predetermined portion to pressure in a tool until the desired shape and thickness of the shaped end is achieved; and i. bending the shaped end relative to the portion of the repair wire that is positioned in the barrel opening to allow the shaped end to lie flat on the first surface of the printed circuit board.

9. The method as in claim 8, wherein the affixing step g includes the method step of:

j. applying a predetermined adhesive between the shaped end and the first surface of the printed circuit board.

10. The method of claim 1, wherein said selecting step c includes the further step of h. selecting a single strand wire comprised of magnet wire.

11. The method of claim 1, wherein said selecting step c further includes the step of h. selecting a single strand wire having electrical insulation material covering all but said predetermined portion formed as said shaped end in accordance with step e.

12. A method of reworking a circuit connection on a multilayer printed circuit board that mounts one or more integrated circuits and having a predetermined ball grid array of solder pads to interconnect each integrated circuit and electrically connected to respectively associated via lands on plated-through hole barrels on a first surface of the printed circuit board, each of the barrels having an opening and extending through the printed circuit board to a second surface and interconnecting to predetermined wiring nets within the printed circuit board, said method comprising the steps of:

a. removing a selected integrated circuit and exposing the array of solder pads requiring circuit alteration;

b. identifying and locating a solder pad to be repaired;

c. protecting the solder pads adjacent to the located solder pad that could be damaged during the repair process;

d. removing the identified solder pad and the via land and interconnecting foil associated with the identified solder pad without interrupting the wiring net associated therewith;

e. selecting a repair wire and threading the selected repair wire through the barrel opening associated with the identified solder pad;

f. after threading the selected repair wire, forming a replacement solder pad substantially in the shape and thickness of the identified and removed solder pad on the exposed end of the repair wire;

g. determining whether or not special coating material for the newly formed solder pad is required, and if required adding the special coating material;

h. forming and bonding the newly formed solder pad to the first surface of the printed circuit board; and i. routing and connecting the repair wire to the corrected circuit connection.

13. The method of claim 12 wherein said selecting step e, includes the further step of j. selecting a single strand wire comprised of magnet wire.

14. The method of claim 12 wherein said selecting step e, includes the further step of j. selecting a single strand wire having electrical insulation material covering all but that portion formed as a replacement solder pad in accordance with step f.

* * * * *